United States Patent [19]

Takemura et al.

[11] 4,324,988
[45] Apr. 13, 1982

[54] SOLID-STATE IMAGING DEVICE DRIVING SYSTEM

[75] Inventors: Yasuo Takemura, Kawasaki; Yoshitaka Katayama, Yokohama, both of Japan

[73] Assignee: Tokyo Shibaura Denki Kabushiki Kaisha, Kawasaki, Japan

[21] Appl. No.: 173,420

[22] Filed: Jul. 29, 1980

Related U.S. Application Data

[63] Continuation of Ser. No. 949,136, Oct. 6, 1978, abandoned.

[30] Foreign Application Priority Data

Oct. 6, 1977 [JP] Japan ................................ 52-119451

[51] Int. Cl.³ ...................... G11C 19/28; H03K 3/42; H01L 29/78; H01L 27/14
[52] U.S. Cl. .............................. 307/221 D; 307/311; 357/24; 357/30
[58] Field of Search ............... 357/24, 30; 307/221 D, 307/311

[56] References Cited

U.S. PATENT DOCUMENTS

| | | | |
|---|---|---|---|
| 3,876,989 | 4/1975 | Bankowski et al. | 357/24 |
| 3,944,816 | 3/1976 | Harada | 357/24 |
| 4,010,319 | 3/1977 | Levine | 357/24 |
| 4,032,976 | 6/1977 | Levine | 357/24 |
| 4,245,164 | 1/1981 | Funahashi | 307/221 D |

OTHER PUBLICATIONS

Sequin, "Interlacing in Charge-Coupled Imaging Devices", IEEE Trans. Electron Devices, vol. Ed-20, (6/73), pp. 535–541.
Tompsett et al., "Charge-Coupling Improves its Image ..." Electronics (Jan. 18, 1973), pp. 162–169.

Primary Examiner—Gene M. Munson
Attorney, Agent, or Firm—Oblon, Fisher, Spivak, McClelland & Maier

[57] ABSTRACT

In a solid-state imaging device, electric charges corresponding to an image are stored in potential wells formed in the semiconductor substrate of a charge transfer device by supplying driving signals of different phases to the electrodes. The phases of the driving signals are changed in order somewhat to shift the potential wells during the charge storage period.

12 Claims, 8 Drawing Figures

SOLID-STATE IMAGING DEVICE DRIVING SYSTEM

This is a continuation, of application Ser. No. 949,136 filed on Oct. 6, 1978 now abandoned.

This invention relates to a system for driving a solid-state imaging device, and more particularly, a solid-state imaging device which uses a charge coupled device (CCD) or bucket brigade device (BBD).

Recently, there has been developed a television camera which uses a solid-state imaging device. This device has the structure in which a large number of electrodes are arranged on the semiconductor substrate through a medium of insulating film, whereby application of a specified voltage to the electrodes causes formation of potential wells within the semiconductor substrate under the electrodes. When an optical image has been projected onto the solid-state imaging device, the charges are induced wich correspond to the optical image and are accumulately stored in the potential wells. The charges thus stored are transfered by moving the potential wells in one direction through sequentially applying voltages to the electrodes in accordance with a specified rule. The charges thus transfered are read out as image signals.

In the case of a three-phase driven CCD, one picture element is formed by application of voltages to three adjoining electrodes, and during the period in which the corresponding charges to the optical image are induced and stored, i.e., during the image pick-up and accumulation period, higher level of voltage than those applied to the central electrode are applied to the remaining two electrodes. Upon this application of voltages, potential wells are formed within the semiconductor substrate under the central electrode. The charges corresponding to one picture element which have been produced in corresponding relationship to the optical image are concentratedly stored in the potential well thus formed. While as mentioned before the stored charge are transfered to be read out, in this case these charges are read out one time per every three electrodes as image signals to undergo sampling of the image signals. Accordingly, when the optical image which varies more finely than equally in size to one picture element has been projected onto the solid-state imaging device, spurious signals are generated in accordance with the sampling theorem to come out on the reproduced picture as beat interference, thereby to remarkably degrade the quality of picture.

On the other hand, the solid-state imaging device is very likely to have such fine defects as would result from non-uniformity of the semiconductor substrate, adherence of dusts to the inner structure of the device during manufacturing process therefor, etc. The presence of such defects in the potential well portions would cause failure of the charges to be accumulated in the potential wells, or would cause generation of the charges in excess, which generation causes saturation of the potential wells with the signal charges. Such failure or saturation would cause production of black and white defective image portions on the reproduced picture to degrade the quality of picture.

Accordingly, it is an object of the invention to provide a solid-state imaging device driving system which is capable of obtaining a good quality of image signals without being substantially affected by the interference signals generated.

It is another object of the invention to provide a solid-state imaging device driving system which even when the solid-state imaging device has defects substantially prevents undesirable phenomena due to such defects from coming out on the reproduced picture.

According to the invention, there is provided a solid-state imaging device driving system which permits a shifting of the potential wells during a specified period in which the charges produced due to projection of an optical image are picked up and accumulated in the potential wells and also permits a picking-up and accumulation of the charge in the respective moved positions of the potential wells to obtain substantially the same effects as these attainable by shifting the phase of the sampling signals, thus to decrease the generation of spurious signals in number and also decrease the effects resulting from the defects inherent in the solid-state imaging device.

This invention can be more fully understood from the following detailed description when taken in conjunction with the accompanying drawings, in which.

Figure 1:
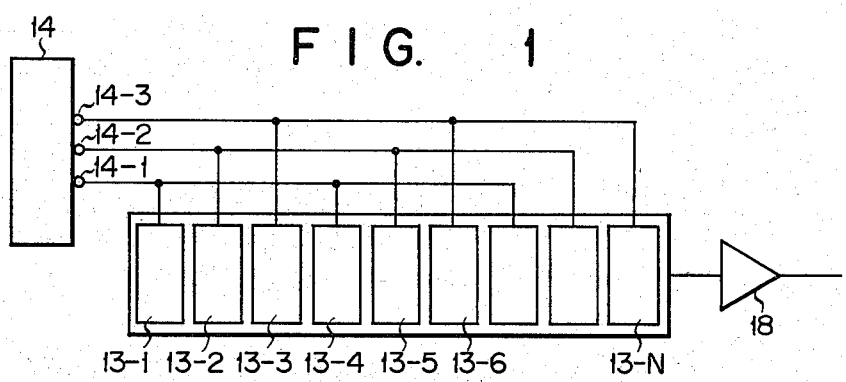
FIG. 1 is an explanatory view of a solid-state imaging device used for an embodiment of this invention.

FIG. 1 shows a one-dimensional CCD (charge coupled device) imaging device. In FIG. 1, an insulating film 12 is formed on a semiconductor substrate 11, and a plurality of electrodes 13-1 to 13-N with a width of 8 $\mu$m are arranged on the insulating film 12 at intervals of 2 $\mu$m. The electrodes 13-1 to 13-N are divided into a plurality of electrode groups, i.e. a first electrode group of electrodes 13-1, 13-2 and 13-3; a second electrode group of electrodes 13-4, 13-5 and 13-6; each electrode group forms a single picture element and the three electrodes of each electrode group are connected to terminals 14-1, 14-2 and 14-3 of a scan generator 14, respectively.

Figure 3:
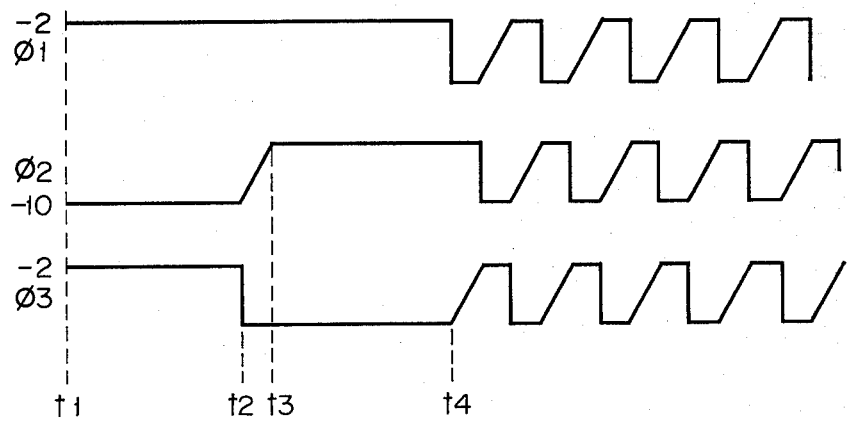
FIG. 3 shows waveforms of drive signals supplied to a charge coupled device (CCD) of the solid-state imaging device according to the invention.

In the aforementioned solid-state imaging device, 3-phase pulse signals $\phi 1$, $\phi 2$ and $\phi 3$ as shown in FIG. 3 are supplied from the scan generator 14 to the electrodes 13-1 to 13-N through the terminals 14-1, 14-2 and 14-3. That is, a period t1-t4 (16 msec) is an image storage period for implementing an image storage mode for selectively achieving integration and shifting during which are induced and charged electric charges corresponding to an optical image. In the period t1-t2 of the image storage period three signals $\phi 1$, $\phi 2$ and $\phi 3$ ($\phi 1 = \phi 3 = -2$ V and $\phi 2 = -10$ V) are supplied to the corresponding electrodes 13-1 to 13-N through the terminals 14-1, 14-2 and 14-3. As a result, a plurality of potential wells 16, 16 . . . are formed in the semiconductor substrate 11 directly under the electrodes 13-2, 13-5, . . . connected to the terminal 14-2. The electric charges corresponding to the optical image are induced and stored in the potential wells.

At time t2, the pulse signal $\phi 1$ is kept constant at $-2$ V, whereas the pulse signal $\phi 2$ gradually increases its level and the pulse signal $\phi 3$ lowers its level. At time t3 $\phi 1 = \phi 2 = -2$ V and $\phi 3 = -10$ V. When the voltages of the pulse signals φ1, φ2 and φ3 take such relationship, potential wells 17, 17 . . . are formed under the electrodes 13-3 and 13-6 connected to the terminal 14-3 for leading the pulse signal φ3, and thereafter the charges stored in the potential wells 16, . . . are transferred to the potential wells 17, . . . . This state is maintained till time t4. Also, the charges produced by the optical image projected by time t4 are stored in the potential wells 17. That is, in the new potential wells 17 are accumulated the newly induced charges and the charges stored in the former potential wells 16.

When the imaging-storage period t1 to t4 has passed, that is after time t4, a transfer period (1 msec) begins. During this transfer period, the pulse signals φ1, φ2 and φ3 having high frequencies and different phases are supplied to the CCD, and thus the potential wells 17 shift their positions successively to the right as illustrated depending on the signals φ1, φ2 and φ3, thereby also transferring the charges stored in the potential wells 17 to the right. Thereafter, the transferred charges are read out as an output signal by an output circuit comprising an output gate or output diode. The output signal is supplied to an amplifier 18, where it is amplified. When all the charges corresponding to the image are read out, the imaging-storage state is resumed. By thus repeating the imaging-storage and the transfer, the desired image signal may be obtained.

By shifting the potential wells through a short distance during the imaging-storage period as aforesaid, the charges stored in the new potential wells are added to the charges in the former potential wells. This shifting of the potential wells causes an effect similar to the effect of the shifting of a sampling phase. As the result, no false signal is allowed to be produced and hence the beat interference is reduced, so that there may be obtained a high-resolution sharp picture. Especially when three electrodes are rendered corresponding to one picture element, the aliasing may be reduced with hardly any deterioration of the resolution of the image signal since the image charges are added by shifting the potential wells through only a fine distance—approximately $\frac{1}{3}$ of the width of the picture element. However, according to this invention, if the CCD is subject to any defect that may cause stains on the reproduced picture, the incidence of such stains may substantially be reduced. If there is a defect below the electrode 13-2 of FIG. 2A to prevent the formation of the potential well thereunder and hence the storage of the charges produced by the optical image, such defect will cause a dark spot to appear on the picture. According to this invention, however, the potential wells are shifted during the imaging-storage period, so that the potential well 17 will be formed below the electrode 13-3 of FIG. 2B to store the charges. Therefore, the charges stored in the potential well 17 under the electrode 13-3 may be read out without the formation of the potential well 16 under the electrode 13-2 to FIG. 2A, thus preventing the defective portion from causing an entire dark spot and practically eliminating the influence of such defect.

Figure 4:
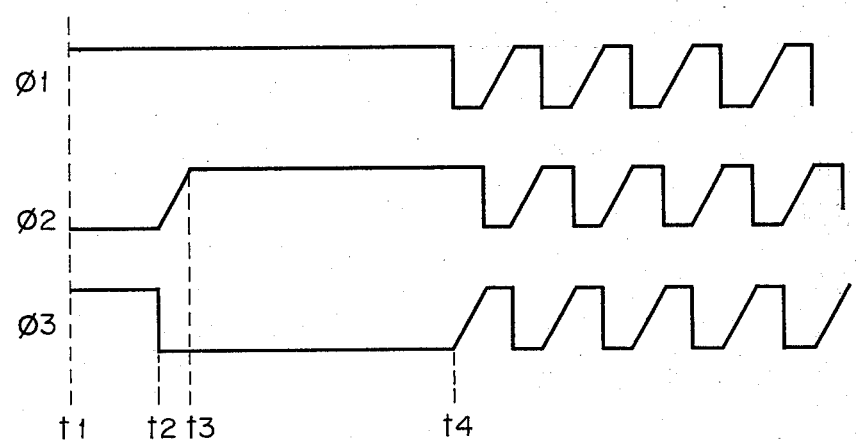
FIGS. 4 to 6 show waveforms of varied drive signals.

Although in the above embodiment the two storage periods t1 to t2 and t3 to t4 are set at an equal length, the period of time t3 to t4 may be longer or shorter than period t1 to t2 at varied time ratios, as shown in FIG. 4. Since the quantity of charges stored in the potential wells increases in proportion to the storage time with a fixed light being projected, addition of the signals with varied levels, i.e. weighting, can be achieved by changing the time ratio. Accordingly, by extending the second storage time twice as long as the first storage time, the second signal may be added to the first signal at a ratio of 2:1.

Figure 2A:
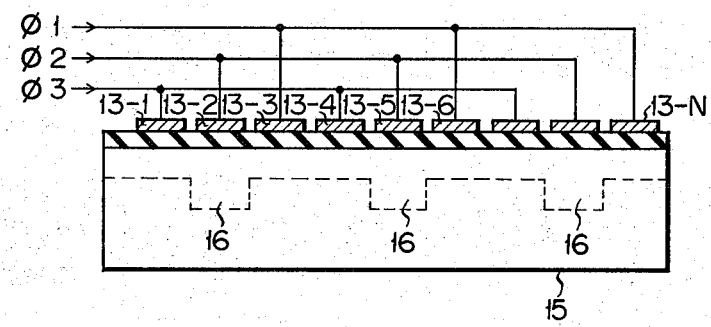
FIGS. 2A and 2B are diagrams illustrating the formation of potential wells.
Figure 2B:
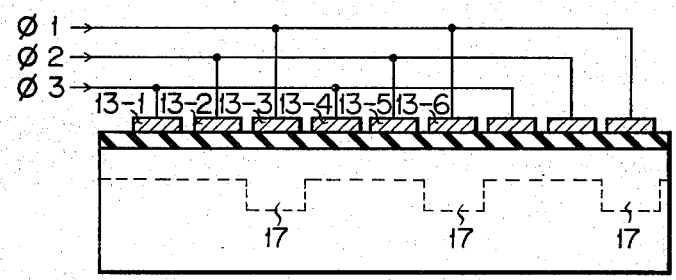
Figure 5:
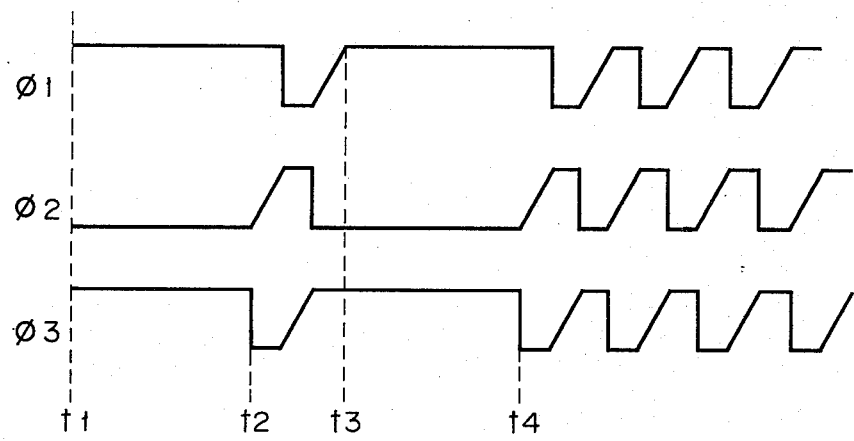

Further, the second storage position is shifted from the first storage position by a distance corresponding to one electrode during the imaging-storage period, according to the aforesaid embodiment, though the former may otherwise be shifted by a distance corresponding to a plurality of electrodes, as shown in FIG. 5. In FIG. 5, pulse signals of one cycle are supplied in time t2 to t3, so that the charges stored below the electrode 13-2 of FIG. 2A are shifted to the right through a distance corresponding to the three electrodes 13-3, 13-1 and 13-2, again forming the potential well under the electrode 13-2. In this case, the result is that the charges are shifted correspondingly to just one picture element, producing the same effect as the case of the addition of one picture element. Consequently, there may be realized the same effect as the case where signals passed through a delay line having a delay time corresponding to one picture element are electrically added. Moreover, if pulse signals of two cycle are supplied in period t2 to t3 of FIG. 5, the charges may be shifted correspondingly to two picture elements i.e. six electrodes, thus producing the same effect as the case of the addition of the signal passed through a delay line having a delay time corresponding to two picture element.

Figure 6:
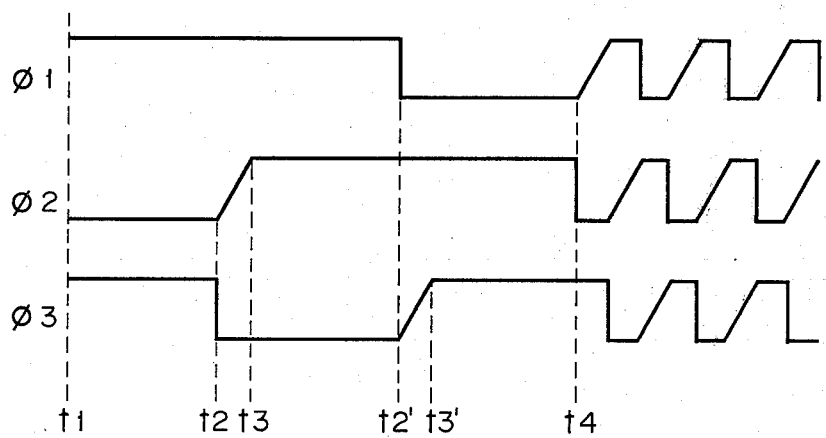

Furthermore, the storage position may be changed a plurality of times (twice in this embodiment) in the imaging-storage period t1 to t4, as shown in FIG. 6. In period t1 to t2 for the first storage state, the potential well is formed under the electrode 13-2 since the waveform of φ2 bears a deep negative potential. Meanwhile, the charges are moved correspondingly to one electrode during period t2 to t3, and the waveform of φ3 takes the deep negative potential, so that the potential well is formed under the electrode 13-3. This state is maintained for period t3 to t2' to provide the second storage state. Further, the charges are again shifted correspondingly to one electrode during period t2' to t3', when the waveform of φ1 resumes the deep negative potential. In consequence, the potential well is formed under the electrode 13-1, and this state is kept for period t3' to t4 to provide a third storage state. Thus, there are formed the three storage positions within the imaging-storage period t1 to t4, and respective charges are added and read out. In this system, therefore, the signals in the three storage positions may easily be added, making it possible more securely to eliminate the influences of false signals or beat interference. There is an additional effect that the picture element may substantially be enlarged in size by forming such plurality of storage positions. According to this system, the size of the picture element may be electronically controlled, and there may be obtained a soft-focus picture, as it is called in photography. Heretofore, such case has required the use of a special optical filter, though this system may facilitate the control by the electronic method. This electronic control will enable continuous changing between a sharp picture with small picture elements and a soft-focus picture with wider picture elements.

Figure 7:
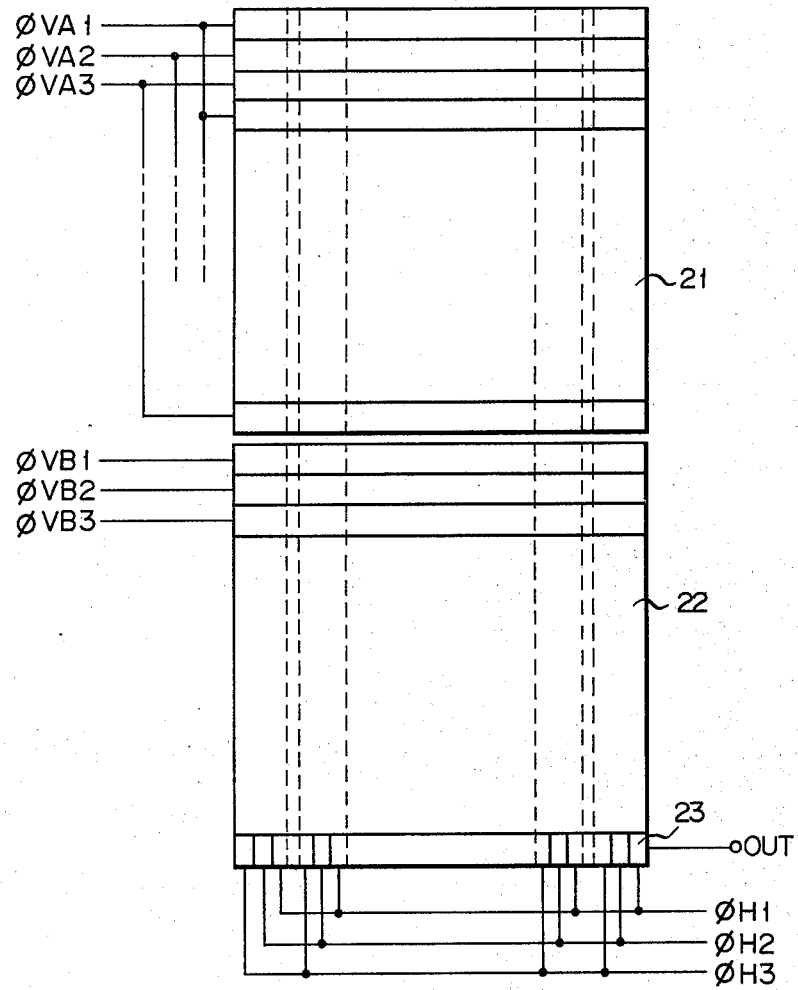
FIG. 7 is an explanatory view of a frame transfer type solid-state imaging device used for another embodiment of the invention.

Naturally, the operations described in connection with the aforementioned embodiments may be combined. That is, it is possible to change the storage position a plurality of times in the imaging-storage period t1 to t4, thereby varying the length of the storage time. By doing this, the irregularity of the waveform may be additionally augmented, so that the interference causing in the sampling will be reduced, the practical size of the picture element enlarged, and the focus softened, thereby providing a smooth and soft picture. Although the CCD used with the aforesaid embodiments is formed of a linearly arranged one-dimensional device, it is to be understood that this invention may be applied to a two-dimensional device comprising a plurality of one-dimensional devices. For example, there may be used image sensors of the so-called frame transfer system, as shown in FIG. 7, wherein a number of image sensors are arranged, including a sensing portion, signal storage portion and a line transfer portion. Referring to FIG. 7, a sensing portion 21 includes a number of line sensors separated by channel stoppers extending in the vertical direction, and the imaging-storage state and the transfer state are repeated by means of pulses applied to three terminals $\phi VA1$, $\phi VA2$ and $\phi VA3$. A signal storage portion 22 once stores signal charges supplied from the sensing portion 21, and delivers them to a line transfer portion 23 by one picture element in accordance with the scanning of the line transfer portion 23. These operations, which are conducted by means of pulses applied to three terminals $\phi VB1$, $\phi VB2$ and $\phi VB3$, are equivalent to the vertical scanning for a standard television system. The line transfer portion 23 transfers to the right-hand-side signal readout portion the charges supplied by means of pulses applied to three terminals $\phi H1$, $\phi H2$ and $\phi H3$. This corresponds to the horizontal scanning. If this invention is applied to the electrodes of the sensing portion 21, addition in the vertical direction may be achieved since the storage position is shifted in the vertical direction during the imaging-storage period. If the storage position is shifted by a distance corresponding to three electrodes, as shown in FIG. 5, a new signal will be able to be added to the signal for the preceeding one horizontal scanning period. That is, this system can eliminate the use of 1 H delay lines which may be required for the prior art system. As for the resolution in the vertical direction, it naturally is subject to the aforementioned effects.

Although the above description has referred only to the three-phase driving CCD, it is to be understood that this invention is not limited to such driving system, and that it may be applied also to two-phase, four-phase or other driving systems.

What is claimed as new and desired to be secured by Letters Patent of the United States is:

1. A system for driving a solid-state imaging device such that a storage mode and a transfer mode are alternated, wherein said imaging device comprises a charge transfer device including a semiconductor substrate, an insulating film formed on said semiconductor substrate and a plurality of electrode groups, each of which includes at least first and second electrodes and forms one picture element, wherein said storage mode includes at least one integration and shifting, and in which in the storage mode a first level signal and a second level signal are supplied respectively to the first and second electrodes during a first period of time, thereby forming a first potential well in which first charges corresponding to an optical image are integrated and then applying said first and second level signals respectively to the second and first electrodes during a second period of time following the first period of time, thereby forming a second potential well to which the first charges integrated are shifted from the first potential well by at least one of the electrodes corresponding to one element and in which second charges corresponding to the optical image are integrated to be added to the first charges, and in the transfer mode high frequency pulse signals in different phases are supplied to the first and second electrodes, thereby transferring the charges integrated from the second potential well to an output circuit; wherein the first and second time periods have a substantially greater time duration than a period of said high frequency pulse signals supplied to said first and second electrodes in the transfer mode.

2. A system for driving a solid-state imaging device such that a storage mode and a transfer mode are alternated, wherein said imaging device comprises a charge transfer device including a semiconductor substrate, an insulating film formed on said semiconductor substrate and a plurality of electrode groups, each of which includes at least first, second and third electrodes and forms one picture element, wherein said storage mode includes at least one integration and shifting, and in which in the storage mode a first level signal is supplied to the first electrode and a second level signal is supplied to the second and third electrodes during a first period of time, thereby forming a first potential well in which first charges corresponding to an optical image are integrated and then said first and second level signals are applied in a predetermined order to said first, second and third electrodes to shift said first charges to the first electrode of a neighboring picture element whereupon there is supplied to said first electrode said first level and to said second and third electrode said second level during a second period of time following the first period of time, thereby forming a second potential well to which the first charges integrated are shifted from the first potential well by at least one element and in which second charges corresponding to the optical image are integrated to be added to the first charges, and in the transfer mode high frequency pulse signals in different phases are supplied to the first, second and third electrodes, thereby transferring the charges integrated from the second potential well to an output circuit; wherein the first and second time periods have a substantially greater time duration than a period of said high frequency pulse signals supplied to said first, second and third electrodes in the transfer mode.

3. A system for driving a solid-state imaging device according to claim 1, wherein one picture element is formed by three electrodes including the first electrode, the second electrode and a third electrode supplied with a constant second level signal during the first and second periods of time.

4. A system for driving a solid-state imaging device according to claim 1 or 3, wherein the first period of time is equal to the second period of time.

5. A system for driving a solid-state imaging device according to claim 1 or 3, wherein the first period of time is shorter than the second period of time.

6. A system for driving a solid-state imaging device according to claim 1, wherein one picture element is formed by three electrodes including the first electrode, the second electrode and a third electrode and the storage mode is performed during the first and second periods of time as well as during a third period of time, and during the first period of time the first electrode is supplied with the first level signal while the second and third electrodes with the second level signal, during the second period of time the first and third electrodes are supplied with the second level signal while the second electrode is supplied with the first level signal, and during the third period of time the first and second electrodes are supplied with the second level signal while the third electrode is supplied with the first level signal.

7. A system for driving a solid-state imaging device according to any one of preceding claims 1, 3, 2 or 6, wherein said charge transfer device is formed of a one-dimensional charge coupled device.

8. A system for driving a solid-state imaging device according to any one of claims 1, 3, 2 or 6, wherein said charge transfer device is formed of a two-dimensional charge coupled device.

9. A system for driving a solid-state imaging device according to claim 4, wherein said charge transfer device is formed of a one-dimensional charge coupled device.

10. A system for driving a solid-state imaging device according to claim 5, wherein said charge transfer device is formed of a one-dimensional charge coupled device.

11. A system for driving a solid-state imaging device according to claim 4, wherein said charge transfer device is formed of a two-dimensional charge coupled device.

12. A system for driving a solid-state imaging device according to claim 5, wherein said charge transfer device is formed of a two-dimensional charge coupled device.

* * * * *